United States Patent [19]
Wiener-Avnear et al.

[11] Patent Number: 4,817,850
[45] Date of Patent: Apr. 4, 1989

[54] REPAIRABLE FLIP-CHIP BUMPING

[75] Inventors: Eliezer Wiener-Avnear, Carlsbad; Ronald L. Williams, San Marcos, both of Calif.

[73] Assignee: Hughes Aircraft Company, Los Angeles, Calif.

[21] Appl. No.: 174,289

[22] Filed: Mar. 28, 1988

[51] Int. Cl.⁴ .............................................. B23K 31/02
[52] U.S. Cl. ................... 228/119; 228/180.2; 29/834; 29/840
[58] Field of Search ..................... 228/119, 191, 180.2, 228/179; 29/832, 834, 840, 854; 156/94

[56] References Cited

U.S. PATENT DOCUMENTS 3,672,034  6/1972  Clark ................................ 228/180.2
4,582,975  4/1986  Daughton ....................... 228/180.2

FOREIGN PATENT DOCUMENTS 2228218   5/1973  Fed. Rep. of Germany ... 228/180.2
287138   12/1986  Japan ............................... 228/180.2

Primary Examiner—Nicholas P. Godici
Assistant Examiner—Samuel M. Heinrich
Attorney, Agent, or Firm—Terje Gudmestad; Kenneth W. Float; A. W. Karambelas

[57] ABSTRACT

A substrate contact structure which includes a plurality of contact pads formed on a surface of the substrate and located for receiving a predetermined integrated circuit chip or die having conductive bonding bumps corresponding to and respectively associated with the plurality of contact pads. Each of the contact pads includes a plurality of bonding sites, wherein the pattern of bonding sites is substantially identical for each of the contact pads. Each bonding site has corresponding bonding sites on the other contact pads which cooperatively form sets of bonding sites, each of which is a mirror image of the conductive bonding bumps on the predetermined integrated circuit chip. Methods of producing substrates suitable for removal and replacement of bump bonded integrated circuit chips, as well as methods of repair of such structures are also disclosed.

11 Claims, 1 Drawing Sheet

REPAIRABLE FLIP-CHIP BUMPING

BACKGROUND OF THE INVENTION

The disclosed invention generally relates to hybrid microcircuit bonding structures and techniques, and is more particularly directed to a repairable hybrid substrate architecture that allows for removal and replacement of bump bonded integrated circuit chips or dies.

In the fabrication of microelectronic circuitry, bump bonding techniques are utilized, for example, to bond and conductively connect integrated circuit microelectronic chips (sometimes called flip-chips) to hybrid circuit substrates which typically include interconnecting conductors and may include circuit elements as well. The number of integrated circuit chips bonded to a given substrate may be 100 chips, for example.

Bump bonding techniques generally involve the deposition of conductive bonding bumps of an appropriate material, such as indium, on the chips and the substrate in mirror image patterns. The bumps are attached by cold weld or reflow techniques, and thus function to bond the chips to the substrate. The bumps further function as conductors for conductively connecting the integrated circuit chips to the substrate conductors.

Bump bonding techniques offer advantages over other bonding techniques such as wire bonding and reflow soldering techniques. These advantages include more efficient fabrication processes, increased circuit density, shorter conductive paths, and the flexibility of locating bonding pads at locations other than at the edges of an integrated circuit chip.

However, chips bonded by bump bonding techniques are not designed for ease of replacement. While a given chip can be pried from the substrate, conventional bonding sites on the substrate contacts cannot be reused to accommodate a replacement chip. As a result, if any chip of a bump bonded hybrid is faulty, then the entire hybrid must be discarded. Such chip failures can be very costly, particularly when failures occur in hybrids that have many chips. Of course, the integrated circuit chips can be tested prior to bonding, but such testing can be costly, inefficient, and cumbersome in comparison to testing the completed hybrid circuit. Moreover, pre-testing of the chips is no guarantee that all the tested chips will not fail at a later time.

For purposes of background reference, a conventional indium bump bonding system and method is described in U.S. Pat. No. 4,573,627, issued to Miller et al. U.S. Pat. No. 4,567,643, issued to Droguet et al., describes a method of replacing an electronic component connected to conducting tracks on a support substrate, wherein the replacement is performed by cutting the tracks and replacing them with new tracks while leaving the tip of the track in place. U.S. Pat. No. 3,735,911, issued to Ward, discloses a tool for repairing integrated circuit chips, but does not appear to address the repair of components fabricated with bump bonding techniques. U.S. Pat. No. 3,969,813, issued to Minetti et al., and U.S. Pat. No. 4,012,832, issued to Crane, relate to nondestructive removal of semiconductor devices or parts thereof, but do not address the repair of circuits fabricated using bump bonding technology.

SUMMARY OF THE INVENTION

It would therefore be an advantage to provide a substrate contact structure that allows for replacement of integrated circuit chips bump bonded thereto.

The foregoing and other advantages and features are provided by the invention which includes a plurality of contact pads formed on a surface of a substrate. The contact pads have predetermined locations on the substrate associated with each integrated circuit chip which is to be mounted on the substrate. Each chip has a set of conductive bonding bumps corresponding to and respectively associated with the plurality of contact pads. Each of the contact pads includes a plurality of bonding sites, wherein the pattern of bonding sites is substantially identical for each of the contact pads. Each bonding site has respectively associated bonding sites on the other contact pads which cooperatively form sets of bonding sites, each of which is a mirror image of the set of conductive bonding bumps on the predetermined integrated circuit chip.

The present invention also contemplates a method of interconnecting bump bonded chips and substrates which permits removal and replacement of defective chips. The method generally comprises providing a substrate having a plurality of contact areas which are located to receive a bump bonded chip. The contact areas are such that they are large enough to permit multiple bonding sites within each contact area which accommodate the bump bonding of the chip without encroaching on adjacent bonding sites withing the area. A chip is then bump bonded to a set of bonding sites. Upon failure of the chip, or upon some other need to remove and replace the chip, the chip is removed and a replacement chip is rebonded to an unused set of bonding sites.

BRIEF DESCRIPTION OF THE DRAWING

The advantages and features of the disclosed invention will readily be appreciated by persons skilled in the art from the following detailed description when read in conjunction with the drawing wherein.

DETAILED DESCRIPTION

Figure 1:
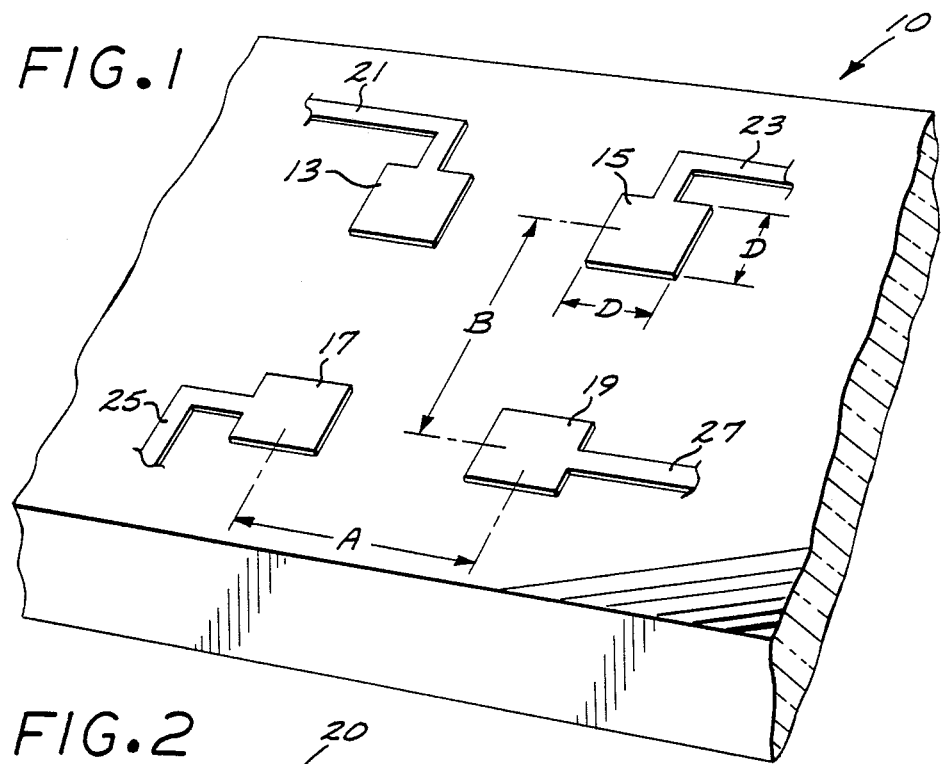
FIG. 1 is a schematic perspective view of a section of a substrate that includes a repairable bump bondable contact structure.

In the following detailed description and in the several figures of the drawing, like elements are identified with like reference numerals.

Referring now to FIG. 1, illustrated therein is a schematic partial perspective of a substrate 10, which by way of example may be a hybrid substrate for use in a hybrid microcircuit. As is well known, the substrate 10 includes conductors for interconnecting integrated circuit chips that are bonded to the substrate. The substrate 10 may also include circuitry that is to be connected to the integrated circuit chips. By way of example, the substrate 10 may comprise silicon, quartz, or ceramic.

Contact areas 13, 15, 17, 19 are formed on the top surface of the substrate 10, and are associated with a predetermined integrated circuit chip. For ease of understanding, only four contact areas are shown, but it should be readily appreciated that the actual implementation of the substrate 10 would include many contact areas for many integrated circuit chips, wherein each chip typically has numerous contacts. As schematically shown, the contact areas 13, 15, 17, 19 are conductively connected to respective conductor traces 21, 23, 25, 27 which may be formed using known techniques including thin film deposition processes.

For reference with respect to the predetermined integrated circuit chip or die which is to be bonded to the contact areas 13, 15, 17, 19, certain dimensions are shown in FIG. 1. The center to center distance between the contacts 17 and 19 is A, while the center to center distance between the contacts 15 and 19 is B. The contact areas 13, 15, 17, 19 are illustrated by way of example as being square, each square having a side dimension D.

Figure 2:
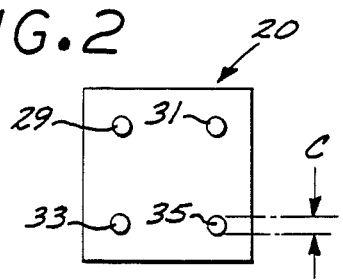
FIG. 2 is a schematic bottom plan view of an integrated circuit chip having conductive bonding bumps which is to be bonded to the contact pads of the substrate of FIG. 1.
Figure 4:
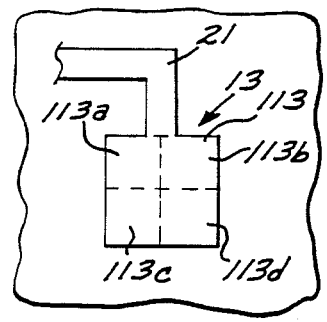
FIG. 4 is a detail top plan view of one of the contact areas of the substrate of FIG. 1.

Referring now to FIG. 2, schematically illustrated therein is a bottom view of an integrated circuit chip 20 which includes conductive bonding bumps 29, 31, 33, 35 of width C formed on the bottom surface thereof. The width C of the conductive bonding bumps 29, 31, 33, 35 is less than one-half the side dimension D of the contact areas 13, 15, 17, 19. The center to center distance between the bumps 33 and 35 is the same as the center to center distance between the contact areas 13 and 15 (FIG. 1), while the center to center distance between the bumps 31 and 35 is the same as the center to center distance between the the contact areas 15 and 19 (FIG. 1).

Figure 3:
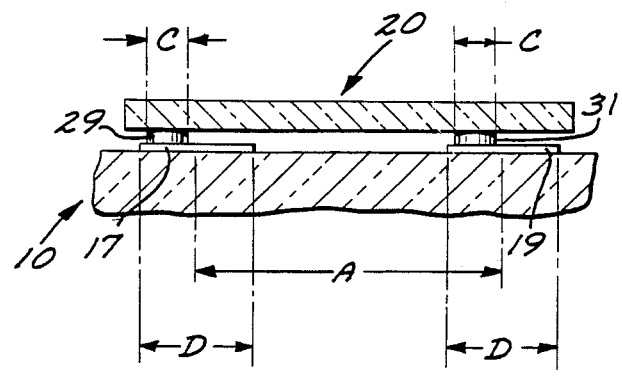
FIG. 3 is a sectional view schematically illustrating an integrated circuit chip or die bump bonded to the contact structure of the substrate of FIG. 1.

The relationship between the integrated 20 and the substrate 10 is further illustrated in FIG. 3.

It is well known to form conductive bonding bumps on integrated circuit chips for use in bonding the chips to substrates having bondable contacts comprising contact pads or conductive bumps, for example. Of course, the respective patterns of the bumps on the chip and the contacts on the substrate are mirror images. As is also well known, the bonded bumps function to bond the chip 20 to the substrate 10 and further provide conductive connections therebetween.

In the following, the contact areas 13, 15 17, 19 are described with particular reference to the contact area 13, since the other contact areas are of substantially similar structure.

Referring now to FIG. 3 relative to the details of the contact areas 13, 15, 17, 19, shown therein is a detailed schematic of the contact area 13, which by way of particular example includes a contact pad 113 formed with known techniques such as thin film deposition of a material that is bump bondable with the conductive bumps of the associated integrated circuit chip 20. As shown, four contiguous bonding sites 113a, 113b, 113c, 113d are defined on the contact pad 113.

Although not shown, for the embodiment having the the contact area structure of FIG. 3, each of the other contact areas 15, 17, 19 includes respective contact pads 115, 117, 119 having four bonding sites similar to and similarly oriented as the bonding sites of the contact pad 113 of FIG. 3. For reference, such bonding sites are similarly designated with the letters a, b, c, and d.

Each of the bonding sites on the contact pads is of sufficient size to accommodate an associated conductive bonding bump of the integrated circuit chip without encroachment on an adjacent bonding site. This is achieved by making each side dimension of a contact pad greater than twice the width of the corresponding conductive bonding bump.

The contact pads 113, 115, 117, 119 are located such that the "a" bonding sites (i.e., 113a, 115a, 117a, 119a) comprise a mirror image of the locations of the conductive bonding bumps 21, 23, 25, 27 on the bottom of the integrated circuit chip 20 of FIG. 2. Since the bonding sites of each of the contact pads 113, 115, 117, 119 are similarly oriented, the "b" bonding sites also comprise a mirror image of the conductive bonding bumps of the associated integrated circuit chip 20, as do the "c" bonding sites and the "d" bonding sites, respectively.

It should be readily evident that the contact pads 113, 115, 117, 119 provide for four separate and distinct sets of bonding sites for bonding with the integrated circuit chip 20, which is achieved by having multiple bonding sites at each contact area. Thus, for example, the integrated circuit chip 20 may be bonded to the "a" bonding sites. In the event the bonded integrated circuit chip is to be replaced, for example as a result of failure, the bonded chip is removed and the replacement integrated circuit chip is then bonded to the "b" bonding sites. More generally, the contact pads having four distinctly defined bonding sites allows for the respective rebonding of up to three additional integrated circuit chips.

It should be readily understood that each of the contact pads 113, 115, 117, 119 can be made smaller or larger to accommodate a fewer or greater number of bonding sites. As indicated previously, each of the bonding sites is of sufficient size to accommodate an associated conductive bump of an integrated circuit chip without encroachment on an adjacent bonding sites within each contact pad.

The contact pads, bonding bumps, and other contact elements disclosed herein can comprise appropriate materials compatible with bump bonding techniques such as cold weld bonding and reflow bonding techniques.

The foregoing has been a disclosure of a substrate contact structure for use with conductive bump bonding techniques wherein each contact area, shown by way of example as a contact pad, includes multiple bonding sites. It should be readily appreciated that other contact structures can be utilized to provide multiple bonding sites for use with bump bonding techniques. For example, a multiple site contact area can comprise a contact pad with a plurality of conductive bonding bumps, each bump comprising a bonding site. As further examples, a multiple bonding site contact area can comprise interconnected pads or conductive bumps, each pad or bump comprising a bonding site.

The foregoing has been a disclosure of a bump bondable repairable contact structure for substrates which provides the advantage of removal and replacement of bonded integrated circuit chips. This structure provides for increased usability of substrates and integrated circuit chips associated therewith. The disclosed contact structure further allows for repair of hybrid microcircuits, avoiding replacement of the entire hybrid circuit.

From the foregoing, it should be readily understood that the present invention also contemplates a method of fabricating a substrate and constructing a hybrid microcircuit which provides for removal and replacement of integrated circuit chips, as the need arises. The method generally comprises providing a substrate having a plurality of contact areas which are located to receive a bump bonded chip. The contact areas are such that they are large enough to permit multiple bonding sites within each contact area which accommodate the bump bonding of the chip without encroaching on adjacent bonding sites withing the area. A chip is then bump bonded to a set of bonding sites. Upon failure of the chip, or upon some other need to remove and replace the chip, the chip is removed and a replacement chip is rebonded to an unused set of bonding sites.

Although the foregoing has been a description and illustration of specific embodiments of the invention, various modifications and changes thereto can be made by persons skilled in the art without departing from the scope of the invention as defined by the following claims.

What is claimed is:

1. A contact structure for use with an integrated circuit chip having conductive bonding bumps for conductively bonding the chip to the contact structure, the contact structure comprising:

a substrate;

a plurality of contact pads disposed on said substrate and located to receive a predetermined integrated circuit chip having conductive bonding bumps respectively associated with said plurality of contact pads; and a plurality of bonding sites defined at each of said plurality of contact pads, said plurality of bonding sites being substantially identical for each of said contact pads, each bonding site having corresponding bonding sites on the other of said plurality of contact pads which cooperatively form sets of bonding sites, each of which forms a mirror image of the conductive bonding bumps on the predetermined integrated circuit chip.

2. The contact structure of claim 1 wherein said contact pads comprise material compatible with cold weld bump bonding.

3. The contact structure of claim 1 wherein said contact pads comprise material compatible with reflow bump bonding.

4. The contact structure of claim 1 wherein said plurality of defined regions for each contact pad comprises a plurality of contiguous rectangular regions.

5. The contact structure of claim 4 wherein each of said rectangular regions is a square.

6. A contact structure for use with integrated circuit chips having conductive bonding bumps, said structure comprising:

a substrate;

a plurality of contact areas defined on a surface of said substrate and located to receive a predetermined integrated circuit chip having conductive bonding bumps respectively associated with said plurality of contact areas; and a plurality of interconnected bonding sites disposed at each of said plurality of defined contact areas and arranged in a predetermined pattern, said predetermined pattern being substantially identical for each of said contact areas, and each bonding site having corresponding bonding sites at each of said plurality of contact areas which cooperatively forms sets of bonding sites, each of which forms a mirror image of the conductive bonding bumps on the predetermined integrated circuit chip.

7. A method for use in interconnecting an integrated circuit die or chip to a substrate which permits the removal and replacement of the die or chip, said method comprising the steps of:

providing a substrate;

forming a plurality of contact pads disposed on said substrate having predetermined sizes and locations;

providing an integrated circuit die or chip having a plurality of bonding pads at predetermined locations that correspond to the locations of said plurality of contact pads, each of said plurality of bonding pads having a size which is less than or equal to one-half of the corresponding contact pad size;

attaching said integrated circuit die or chip to said substrate by attaching said plurality of bonding pads to a predetermined portion of each of said respective plurality of contact pads;

detaching said die or chip from said substrate; and reattaching a replacement die or chip to said substrate by attaching said plurality of bonding pads to a previously unused portion of each of said plurality of contact pads.

8. A method for use in interconnecting an integrated circuit die or chip to a substrate which permits the removal and replacement of the die or chip, said method comprising the steps of:

providing a substrate;

forming a plurality of contact pads disposed on said substrate having predetermined sizes and locations;

providing an integrated circuit die or chip having a plurality of conductive bonding bumps at predetermined locations that correspond to the locations of said plurality of contact pads, each of said plurality of bonding bumps having a size which is less than or equal to one-half of the corresponding contact pads size;

attaching said integrated circuit die or chip to said substrate by attaching said plurality of bonding bumps to a predetermined portion of each of said respective plurality of contact pads;

detaching said die or chip from said substrate;

reattaching a replacement die or chip to said substrate by attaching said plurality of bonding bumps of said replacement die or chip to a previously unused portion of each of said plurality of contact pads.

9. The method of claim 8 wherein said step of attaching said plurality of bonding bumps comprises the step of cold welding said plurality of bonding bumps to said plurality of contact pads.

10. The method of claim 8 wherein said step of attaching said plurality of bonding bumps comprises the step of fusion bonding said plurality of bonding bumps to said plurality of contact pads.

11. The method of claim 8 wherein said step of attaching said plurality of bonding bumps comprises the step of metal reflow soldering said plurality of bonding bumps to said plurality of contact pads.

* * * * *